United States Patent
Park

(10) Patent No.: US 6,643,190 B1
(45) Date of Patent: Nov. 4, 2003

(54) PACKET COMMAND DRIVING TYPE MEMORY DEVICE

(75) Inventor: Nak Kyu Park, Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 252 days.

(21) Appl. No.: 09/604,337

(22) Filed: Jun. 27, 2000

(30) Foreign Application Priority Data

Jun. 28, 1999 (KR) .............................. 99-24578

(51) Int. Cl.$^7$ .............................................. G11C 16/04
(52) U.S. Cl. ........................ 365/189.05; 365/189.11; 365/189.12
(58) Field of Search ................ 365/189.05, 189.11, 365/189.12, 194, 233; 327/144

(56) References Cited

U.S. PATENT DOCUMENTS

| 5,384,750 A | 1/1995 | Lee |
| 5,404,338 A | 4/1995 | Murai et al. |
| 5,875,219 A | * 2/1999 | Kim ........................... 327/144 |
| 5,886,946 A | 3/1999 | Ooishi |
| 5,946,245 A | 8/1999 | Brown et al. |

FOREIGN PATENT DOCUMENTS

| JP | 8-212778 | 8/1996 |
| JP | 11025696 | 1/1999 |
| JP | 11203859 | 7/1999 |

* cited by examiner

Primary Examiner—David Lam
(74) Attorney, Agent, or Firm—Pillsbury Winthrop LLP

(57) ABSTRACT

The present invention relates to a packet command driving type memory device, comprises a first signal generating means for receiving a signal being generated from a register and generating a domain signal of certain bit; a second and a third signal generating means for generating a first and a second control signal for loading data; a fourth and a fifth signal generating means for generating a third and a fourth control signal for reading data from a core block; a data output shift part for shifting the data read from the core block according to the first and the second control signal generated from the second and a third signal generating means and a clock signal, delaying the shifted data by a certain time according to the domain signal generated from the first signal generating means according to each domain and compensating for a data output time and outputting it.

15 Claims, 15 Drawing Sheets

PACKET COMMAND DRIVING TYPE MEMORY DEVICE

BACKGROUND OF THE INVENTION

1. Field of the Invention

The present invention relates to a packet command driving type memory device, particularly, to a packet command driving type memory device that can control a data output time stably and reduce an area by controlling each latency time on a long bus channel in a shift register directly.

2. Description of the Related Art

FIG. 1 shows a channel structure in a general packet command driving type memory device, for example, a memory device such as a RAMBUS DRAM. Referring to FIG. 1, a number of RAMBUS DRAMs are connected on a long bus channel, a phase difference between CTM and CFM is different every each RAMBUS DRAM. A region that a phase difference increases from a spot of "0" to a spot of "1" is referred to as a latency domain.

In a case of the longbus channel, by that a device of the latency domain being far apart from a controller reads data quickly, that the device of the latency domain being near from a controller reads data slowly, a controller can recognize data in an identical point of time from every device.

FIG. 2 shows an interface part and a shift register of a memory device for controlling a data output time according to a prior latency domain.

Referring to FIG. 2, the interface part for controlling a prior data output time comprises a first signal generating means 1 for receiving a signal SDAC<2:0> generated from a register 11 in the inside of a RAMBUS DRAM device and generating a signal rd5_en and a signal tDAC<4:1>, a second signal generating means 2 for receiving a signal SRD<2:0> generated from the register 11 in the inside of the RAMBUS DRAM device and generating a signal rd_dly<2:0>, a third signal generating means 3 for receiving a signal tDAC<4:1> generated from the first signal generating means 1 and outputting an intermediate internal signal loadRDpipe to a data output shift part, a fourth signal generating means 4 for receiving the signal tDAC<4:1> and the signal rd_dly<2:0> generated from the first and the second signal generating means 1, 2 and outputting an intermediate internal signal drainRDpipe to a data output shift part 8.

Also, the prior interface part further comprises a fifth and a sixth signal generating means 5, 6 for receiving the signal rd_dly generated from the second signal generating means 2 and outputting a signal COLLAT and a signal COLCYC to a core block 10 respectively, a seventh signal generating means 7 for receiving the signal rd_dly generated from the second signal generating means 2 and outputting a signal WriteD0123 and a signal WriteD4567 to a data input shift part 9. The signal generating means 1–7 are composed of a logic circuit.

The prior memory device having the above-mentioned structure receives a signal SDAC<2:0> generated from a register 11 in the inside of a device and decodes it and outputs the signal rd5_en to the data output shift part 8, outputting a signal tDAC<4:1> to the third and the fourth signal generating means 3, 4, the second signal generating means 2 receives a signal SRD<2:0> and outputs a signal rd_dly to the fourth signal generating means 4 and the fifth to the seventh signal generating means 5–7.

Accordingly, each signal generating means regulates an internal intermediate signal COLLAT, COLCYC, loadRDpipe, drainRDpipe, WriteD0123, WriteD4567 and delays an output time of read data by "1t cycle".

On one hand, a signal rd5_en is inputted directly to a data output shift part 8 and causes to generate clock signals (tclk1, tclk1b), (tclk2, tclk2b) within the data output shift part 8 and control the data output shift part 8, thereby output data by delaying by "1t cycle".

That is, by that the data output shift part 8 shifted data Read_Data read from the core block 10 by using a load signal loadRDpipe, drainRDpipe and a clock signal tclk, generated the internal clock signals (tclk1, tclk2) by using a signal rd5_en via a block 81 and controlled a block 82, see FIG. 3, the data output shift part 8 delayed the signal by "1t cycle" and compensated for an output time of data and thereby transferred data.

As described above, to compensate for an output time of data, a prior memory device generates signals rd5_en, tDAC<4:1>, rd_dly<2:0> by using signals SDA<2:0> and SRD<2:0> being generated from the register 11 via each signal generating means 1–7, as drawn in FIG. 1, generates numerous control signals such as intermediate internal signals loadRDpipe, drainRDpipe, WriteD4567, COLLAT, COLCYC, etc., being subject to these signals, there was a problem that a logic composition for generating this intermediate internal signal was necessary in each signal generating means.

Also, as drawn in FIG. 2, there was a problem that a prior data output shift part 8 required a circuit receiving a signal rd_dly<2:0> and generating an internal clock signal, occupied a broad layout area.

And, as pulse widths of signals Write4567, loadRDpipe are made to 0.5t cycle to satisfy a data hold time as FIG. 5A to FIG. 7A, there was a problem that an operation was unstable.

SUMMARY OF THE INVENTION

This invention is invented to solve the above-mentioned prior problems, it is an object of this invention to provide a packet command driving type memory device for generating a domain signal by using a signal being generated from a register within a device and controlling a data output time directly from a shift register.

It is another object of this invention to provide a packet command driving type memory device for simplifying a logic composition of a shift register by controlling a data output time directly from a shift register by using a signal generated from a register instead of generating a control signal for controlling a shift register part in an interface part by using a signal being generated from a prior register.

It is another object of this invention to provide a packet command driving type memory device for operating stably even in a domain region which a phase difference is big by using a pulse signal having a width of "1t cycle" exactly.

To achieve an object of this invention, this invention comprises a first signal generating means for receiving a signal being generated from a register and generating a domain signal of certain bit; a second and a third signal generating means for generating a first and a second control signal for loading data; a fourth and a fifth signal generating means for generating a third and a fourth control signal for reading data from a core block; a data output shift part for shifting the data read from the core block according to the first and the second control signal generated from the second and a third signal generating means and a clock signal, delaying the shifted data by a certain time according to the domain signal generated from the first signal generating means according to each domain and compensating for a data output time and outputting it.

The data output shift part comprises a shift means for shifting the data read from the core block according to the first and the second control signal generated from the second and a third signal generating means and a clock signal; a data output time compensating means for delaying an output signal of the shift means by a certain time according to the domain signal generated from the first signal generating means and compensating for a data output time, outputting the compensated signal as read data via a data pad.

The data output time compensating means comprises a delay means for delaying the output signal of the shift means by a certain time according to the domain signal generated from the first signal generating means; a transfer means for transferring one of the signal delayed via the delay means or the output signal of the shift means as read data according to the domain signal generated from the first signal generating means.

And, the domain signal is 4 bits signal, the domain is divided to 5 domains.

In the data output time compensating means, the delay means comprises a number of means for delaying the output signal of the shift means by it cycle according to the domain signal.

The first delay means comprises a first transfer gate for transferring the output signal of the shift means according to a first domain signal of the domain signal generated from the first signal generating means; a first flip flop for delaying the data transferred via the first transfer gate by 1t cycle in response to the clock signal.

The second delay means comprises a second transfer gate for transferring the data delayed by 1t cycle via the first flip flop of the first delay means according to a second domain signal of the domain signal generated from the first signal generating means; a second flip flop for delaying an output of the second transfer gate by 1t cycle in response to the clock signal and outputting data delayed by 2t cycle.

The third delay means comprises a third transfer gate for transferring the data delayed by 2t cycle via the second flip flop of the second delay means according to a third domain signal of the domain signal generated from the first signal generating means; a third flip flop for delaying data transferred via the second transfer gate by 1t cycle again in response to the clock signal and outputting data delayed by 3t cycle.

The fourth delay means comprises a fourth transfer gate for transferring the signal delayed by 3t cycle via the third flip flop of the third delay means according to a fourth domain signal of the domain signal generated from the first signal generating means; a fourth flip flop for delaying data transferred via the transfer gate by 1t cycle in response to the clock signal and outputting data delayed by 4t cycle.

In the data output time compensating means, the transfer means comprises a first to a fourth transfer means for transferring the output signal of the shift means according to the domain signal generated from the first signal generating means or the signal delayed via the first to the fourth delay means of the delay means.

The first transfer means comprises a fifth transfer gate for transferring the output signal of the shift means according to a first domain signal of the domain signal generated from the first signal generating means. The second transfer means comprises a sixth transfer gate for transferring the output signal of the shift means in a first domain, an output of the first delay means in a second domain according to a second domain signal of the domain signal generated from the first signal generating means. The third transfer means comprises a seventh transfer gate for transferring an output of the sixth transfer gate in a first domain, an output of the second delay means in a third domain according to a third domain signal of the domain signal generated from the first signal generating means. The fourth transfer means comprises a eighth transfer gate for transferring an output of the seventh transfer gate in a first domain, an output of the third delay means in a third domain according to a fourth domain signal of the domain signal generated from the first signal generating means.

Also, the present invention comprises a first signal generating means for receiving a signal being generated from a register and generating a domain signal of certain bit; a second and a third signal generating means for generating a first and a second control signal for shifting data; a fourth and a fifth signal generating means for generating a third and a fourth control signal for reading data from a core block; a data output shift part having a shift means for shifting the data read from the core block according to the first and the second control signal generated from the second and a third signal generating means and a clock signal, a data output time compensating means for delaying the data shifted via the shift means by a certain time according to the domain signal generated from the first signal generating means according to each domain and compensating for a data output time and outputting the compensated signal as read data via a data pad.

The data output shift part outputs the data transferred via the shift means as read data to the data pad without a delay via the transfer means in a domain 1, outputs the data transferred via the shift means as read data to the data pad via the transfer means by delaying them by 1t cycle via a delay means and compensating for a data output time in a domain 2, outputs the data transferred via the shift means as read data to the data pad via the transfer means by delaying them by 2t cycle via a delay means and compensating for a data output time in a domain 3, outputs the data transferred via the shift means as read data to the data pad via the transfer means by delaying them by 3t cycle via a delay means and compensating for a data output time in a domain 4, outputs the data transferred via the shift means as read data to the data pad directly by delaying them by 4t cycle via a delay means and compensating for a data output time in a domain 5.

BRIEF DESCRIPTION OF THE DRAWINGS

FIG. 6A to FIG. 10A show operation waveforms of a prior packet command driving type memory device.

FIG. 6B to FIG. 10B show operation waveforms of a packet command driving type memory device according to an embodiment of this invention.

DETAILED DESCRIPTION OF THE INVENTION

Figure 4:
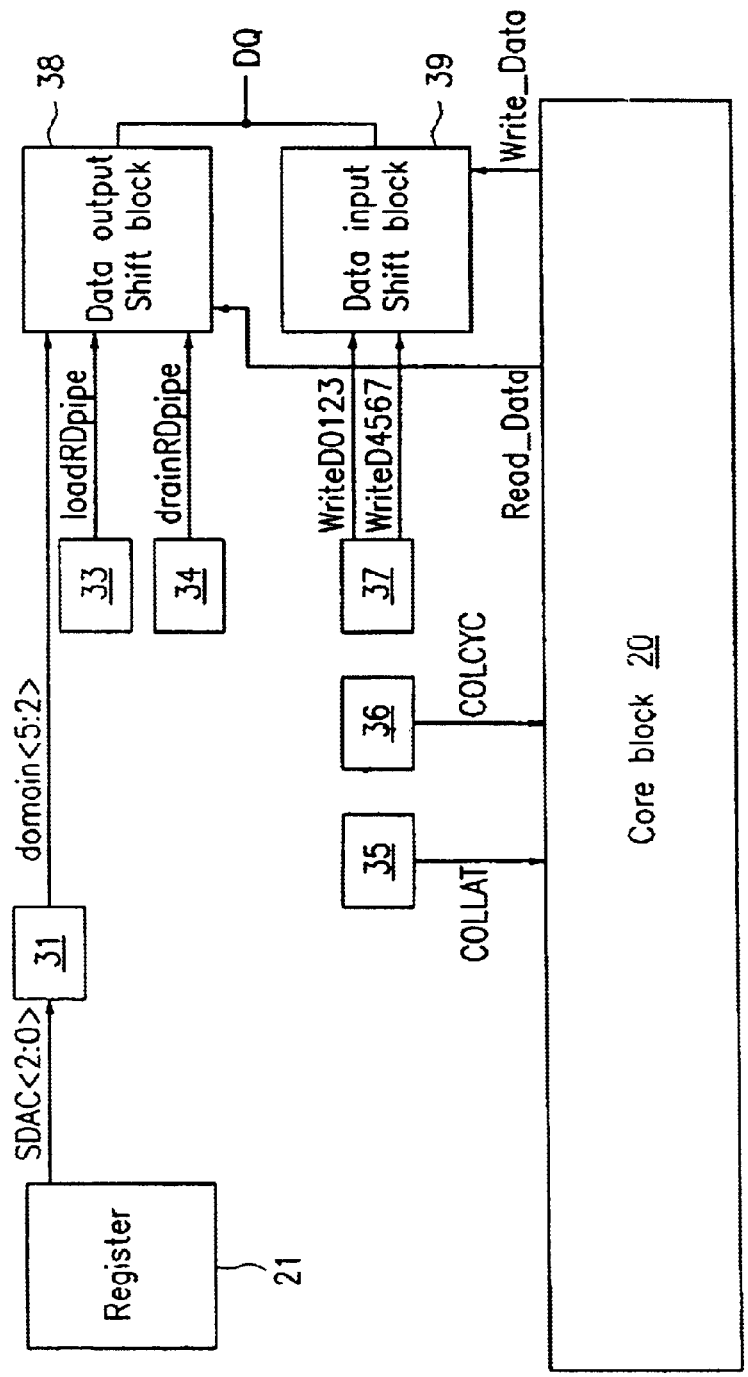
FIG. 4 is a rough block diagram of a packet command driving type memory device according to an embodiment of this invention.

Hereinafter, a preferred embodiment of this invention will be explained in more detail with reference to the accompanying drawings. FIG. 4 shows an interface part and a shift register part for controlling a data output time according to an embodiment of this invention.

Referring to FIG. 4, an interface part for compensating for a data output time comprises a first signal generating means 31 for receiving a signal SDAC<2:0> being outputted from a register 21 within a device when initializing a system and outputting a domain signal domain<5:1> to a data output shift part 38, a second and a third signal generating means 33, 34 for outputting a signal loadRDpipe and a signal drainRDpipe to the data output shift part 38 respectively, a fourth and a fifth signal generating means 35, 36 for outputting a signal COLLAT and a signal COLCYC to the core block 20 respectively, a sixth signal generating means 37 for outputting a signal Write0123 and a signal Write4567 to a data input shift part 39.

Figure 1:
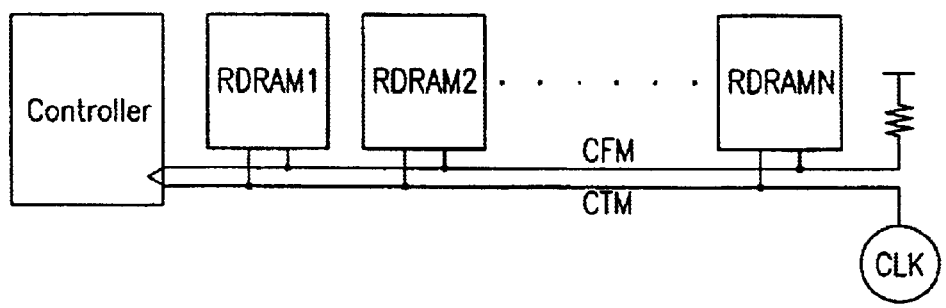
FIG. 1 shows a channel structure in a general RAMBUS DRAM.

As drawn in FIG. 4, a data output time control circuit of this invention generates a domain signal domain<5:1> being able to control the data output shift part 38 directly by using only a signal SDAC<2:0> being outputted from a register 21 unlike a prior control circuit of FIG. 1. Therefore, as a signal generating means 2 for generating a signal rd_dly<2:0> isn't required unlike the past, signal generating means 33–37 for generating an intermediate internal signal, a signal loadRDpipe, a signal drainRDpipe, a signal Write0123, a signal Write4567, a signal COLLAT and a signal COLCYC are not controlled by the signal rd_dly<2:0> or a signal tDAC<4:1> unlike the past, the signal generating means 33–37 aren't necessary, a logic realization is not only simple, but also a lay out area is reduced.

Figure 5:
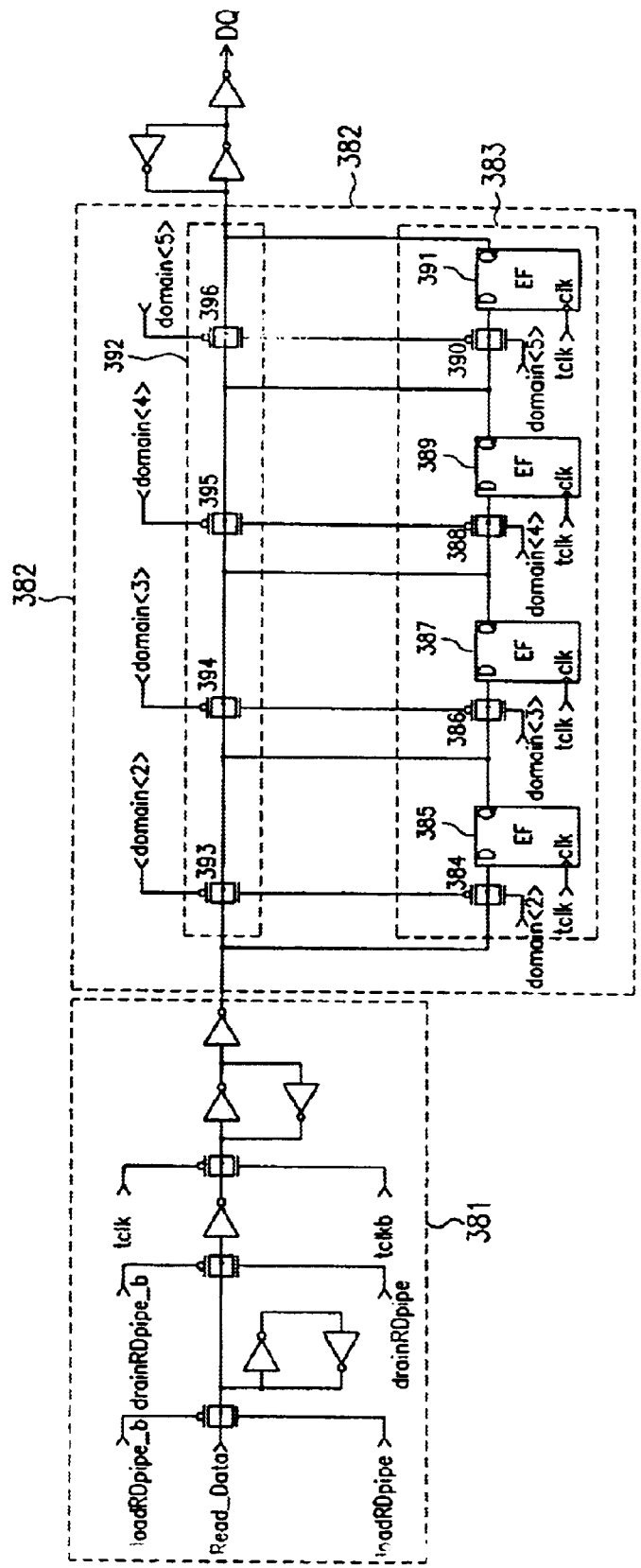
FIG. 5 is a circuit of :a data output shift part having a data output time compensating means in a packet command driving type memory device of FIG. 4.

FIG. 5 shows a data output shift part 38 having a means for compensating for a data output time according to an embodiment of this invention in detail. The data output shift part 38 comprises a shift means 381 for shifting data Read_data read from the core block 20 according to a pair of first load signals loadRDpipe, loadRDpipe_b being generated from the second signal generating means 33, and a pair of second load signals drainRDpipe, drainRDpipe_b being generated from the third signal generating means 34, and a pair of signals tclk, tclkb, a data output time comparing means 382 for delaying read data Read_data shifted via the shift means 381 and compensating for a data output time and outputting it according to a domain signal domain<5:2> generated from the first signal generating means 31.

Figure 2:
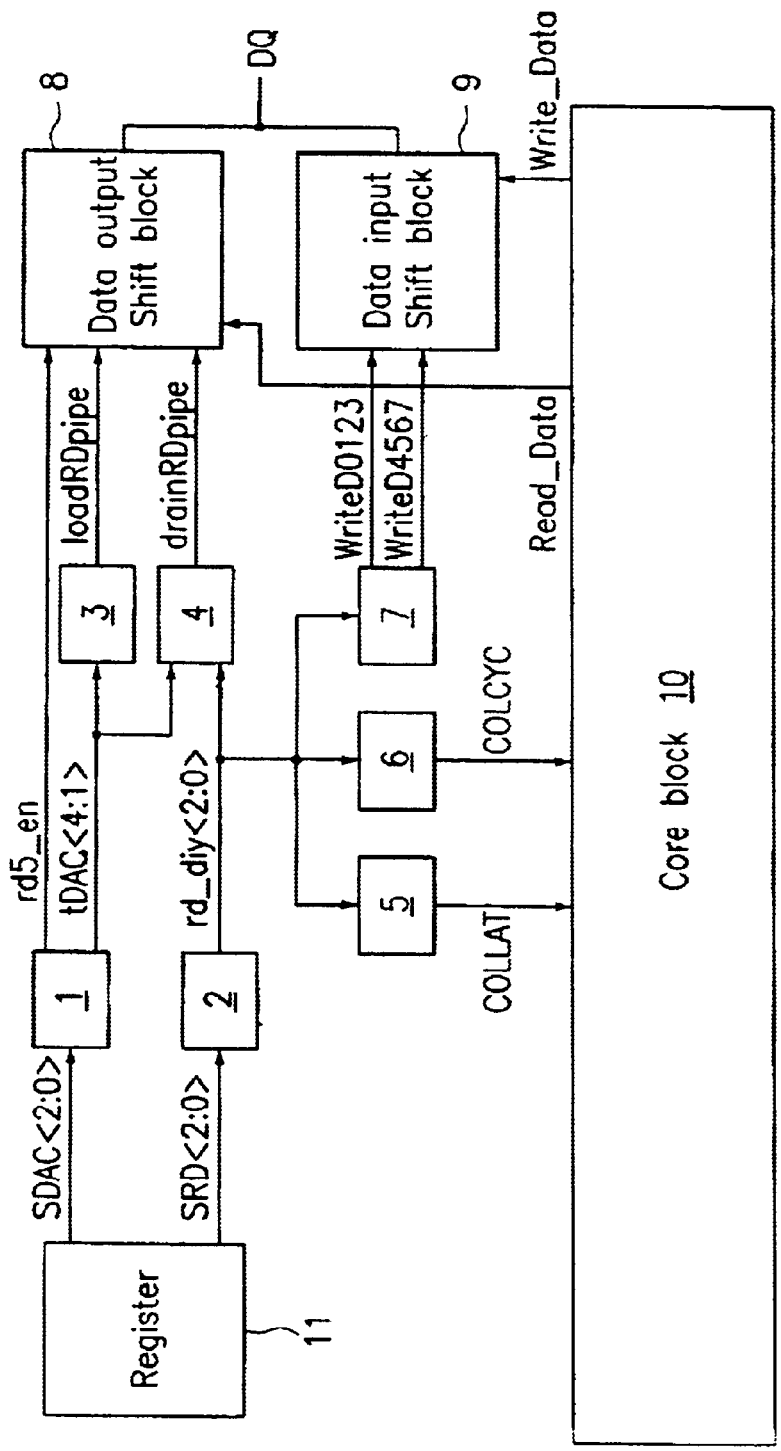
FIG. 2 is a rough block diagram of a prior packet command driving type memory device.
Figure 3:
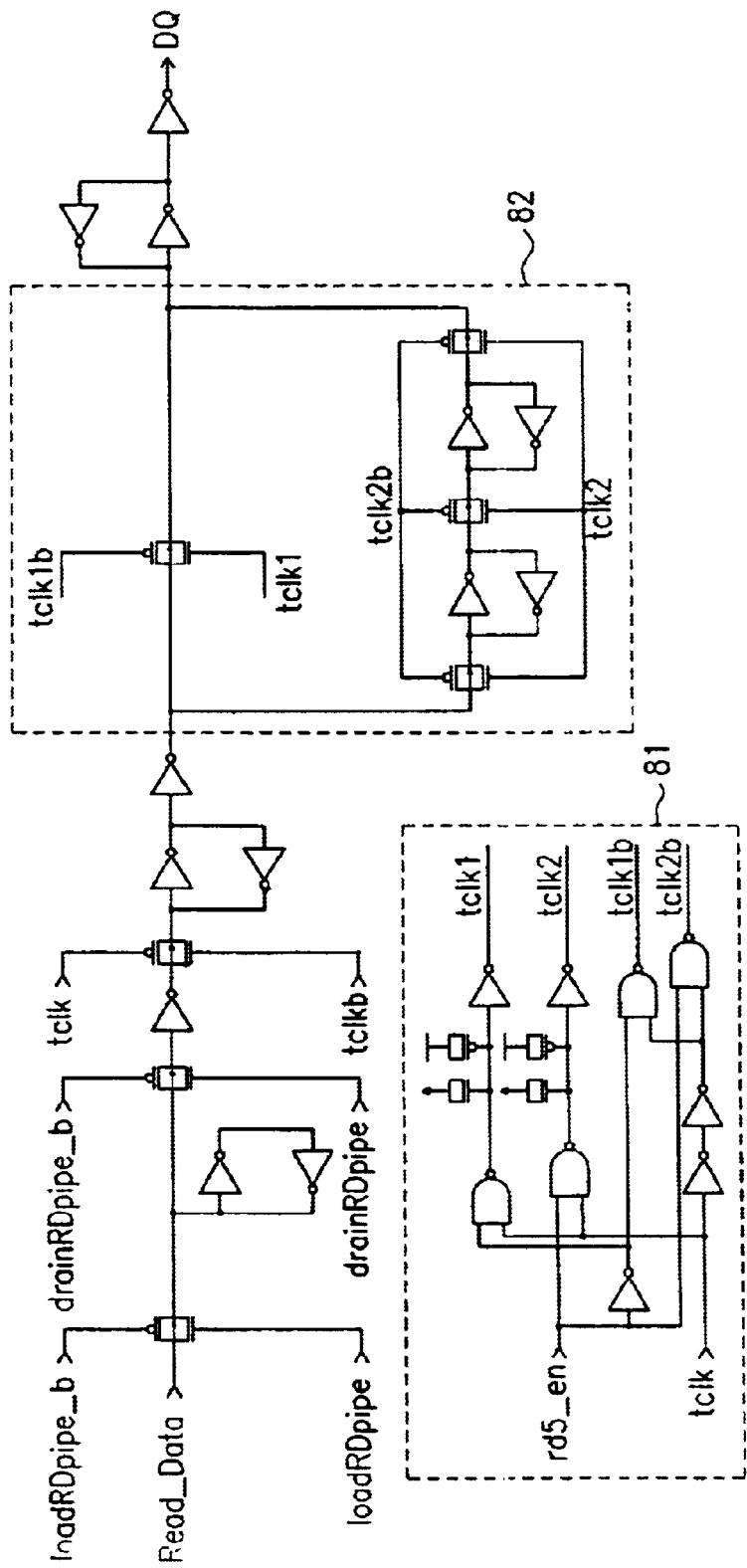
FIG. 3 is a rough drawing of a data output shift part in a packet command driving type memory device of FIG. 2.

A composition and an operation of the shift means 381 of the data output shift part 38 are same that of a prior data output shift part 8 of FIG. 2.

The data output time comparing means 382 of the data output shift part 38 comprises a delay means 383 for delaying an output of the shift means 381 sequentially according to domain signals domain<5:2>, domainb<5:2> and a clock signal tclk, a transfer means 392 for transferring the outputs of the shift means 381 or the delay means 383 sequentially according to the domain signals domain<5:2>, domainb<5:2> being generated from the first signal generating means 31.

The delay means 383 comprises a first delay means for delaying an output signal of the shift means 381 according to a first domain signal domain<2> and a signal domainb<2> of the domain signal generated from the first signal generating means 31, a second delay means for delaying an output signal of the first delay means according to a second domain signal domain<3> and a signal domainb<3> of the domain signal generated from the first signal generating means 31, a third delay means for delaying an output signal of the second delay means according to a third domain signal domain<4> and a signal domainb<4> of the domain signal generated from the first signal generating means 31, a fourth delay means for delaying an output signal of the third delay means according to a fourth domain signal domain<5> and a signal domainb<5> of the domain signal generated from the first signal generating means 31.

The first delay means of the delay means 383 comprises a first transfer gate 384 for transferring the output signal of the shift means 381 according to a first domain signal domain<2> and a signal domainb<2> generated from the first signal generating means 31, a first flip flop 385 for being triggered in an ascending edge of a clock signal tclk being inputted to a clock terminal and delaying the signal transferred via the first transfer gate 384, i.e., the output signal of the shift means 381, by "1t cycle".

The second delay means comprises a second transfer gate 386 for transferring the output signal of the first flip flop 385 of the first delay means according to a second domain signal domain<3> and a signal domainb<3> generated from the first signal generating means 31, a second flip flop 387 for being triggered in an ascending edge of a clock signal tclk being inputted to a clock terminal and delaying the output of the second transfer gate 386 by "1t cycle".

The third delay means comprises a third transfer gate 388 for transferring the output signal of the second flip flop 387 of the second delay means according to a third domain signal domain<4> and a signal domainb<4> generated from the first signal generating means 31, a third flip flop 389 for being triggered in an ascending edge of a clock signal tclk being inputted to a clock terminal and delaying the output of the third transfer gate 388 by "1t cycle".

The fourth delay means comprises a fourth transfer gate 390 for transferring the output signal of the third flip flop 389 of the third delay means according to a fourth domain signal domain<5> and a signal domainb<5> generated from the first signal generating means 31, a fourth flip flop 391 for being triggered in an ascending edge of a clock signal tclk being inputted to a clock terminal and delaying the output of the fourth transfer gate 390 by "1t cycle" and outputting it via a data pad DQ.

The transfer means 392 comprises a first to a fourth transfer means for transferring the output signal of the shift means 381 or an output of the delay means 383 according to the domain signal domain<5:2> and a signal domain<5:2> generated from the first signal generating means 31.

The first transfer means of the transfer means 392 comprises a fifth transfer gate 393 for transferring the output signal of the shift means 381 according to a first domain signal of a first domain signal domain<2> and a signal domainb<2> generated from the first signal generating means 31.

The second transfer means comprises a sixth transfer gate 394 for transferring one of the output signal of the fifth transfer gate 393 of the first transfer means or the output signal of the first flip flop 385 of the first delay means of the delay means 383 according to a second domain. signal domain<3> and a signal domainb<3> generated from the first signal generating means 31.

The third transfer means comprises a seventh transfer gate 395 for transferring one of the output signal of the sixth transfer gate 394 of the second transfer means or the output signal of the second flip flop 387 of the second delay means of the delay means 383 according to a third domain signal domain<4> and a signal domainb<4> generated from the first signal generating means 31.

The fourth transfer means comprises a eighth transfer gate 396 for transferring one of the output signal of the seventh transfer gate 395 of the third transfer means or the output signal of the third flip flop 389 of the third delay means of the delay means 383 according to a fourth domain signal domain<5> and a signal domainb<5> generated from the first signal generating means 31.

Hereinafter, an operation of a data output shift part having the above-mentioned composition will be explained.

The data read from the core block 20 according to a signal COLLAT and a signal COLCYC generated from the fourth and the fifth signal generating means 35, 36 are shifted via a transfer gate of the shift means 31 according to a signal loadRDpipe and a signal loadRDpipeB generated from the second signal generating means 33 and a signal drainRDpipe and a signal drainRDpipeb generated from the third signal generating means 34 and clock signals tclk, tclkb.

An output signal of the shift means 381 is inputted to a data output time comparing means 382 and a data output time is compensated for and outputted via a data pad DQ according to a domain domain<5:2> and domainb<5:2> generated from the first signal generating means 31.

The following table shows a relation between a domain signal domain<5:2> and each domain being generated from the first signal generating means 31.

TABLE 1

| domain | domain<2> | domain<3> | domain<4> | domain<5> |
|---|---|---|---|---|
| 1 | 0 | 0 | 0 | 0 |
| 2 | 1 | 0 | 0 | 0 |
| 3 | 1 | 1 | 0 | 0 |
| 4 | 1 | 1 | 1 | 0 |
| 5 | 1 | 1 | 1 | 1 |

Figure 6A:
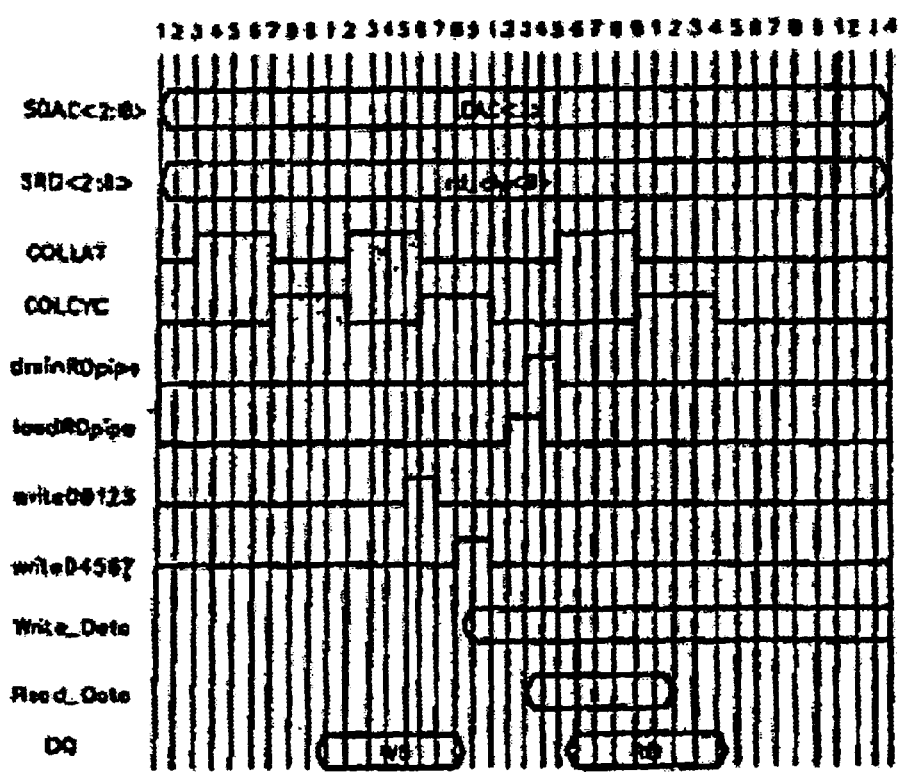
Figure 6B:
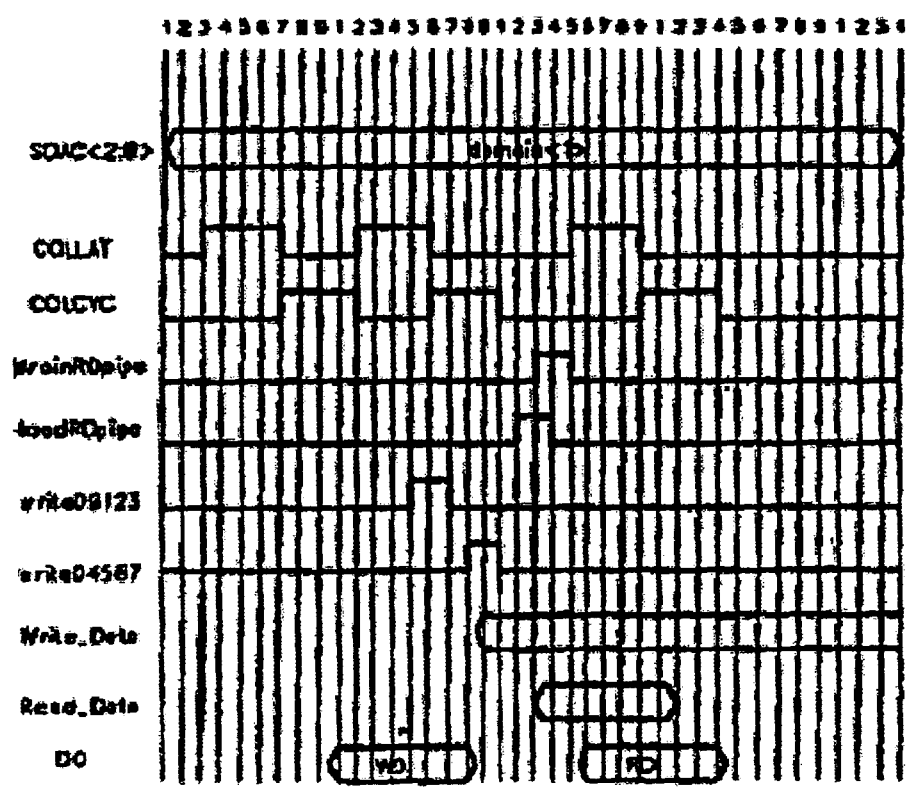

That is, as the domain signal domain<5:2> becomes 0000 in a domain 1 as the above table 1, all the transfer gates 393–396 of the transfer means 392 of the data output time comparing means 382 are turned on, thus an output of a shift means 381 is transferred sequentially via the transfer gates 393–396 and outputted as read data RD as it is without a delay via an output pad DQ as FIG. 6B.

Figure 7A:
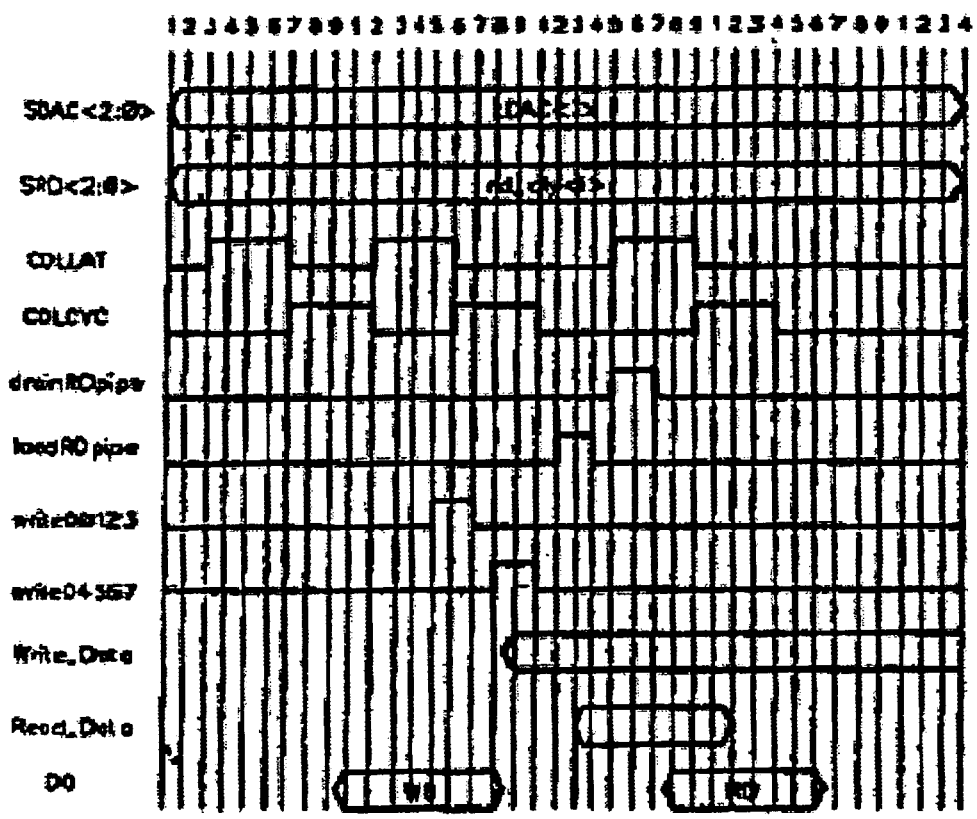
Figure 7B:
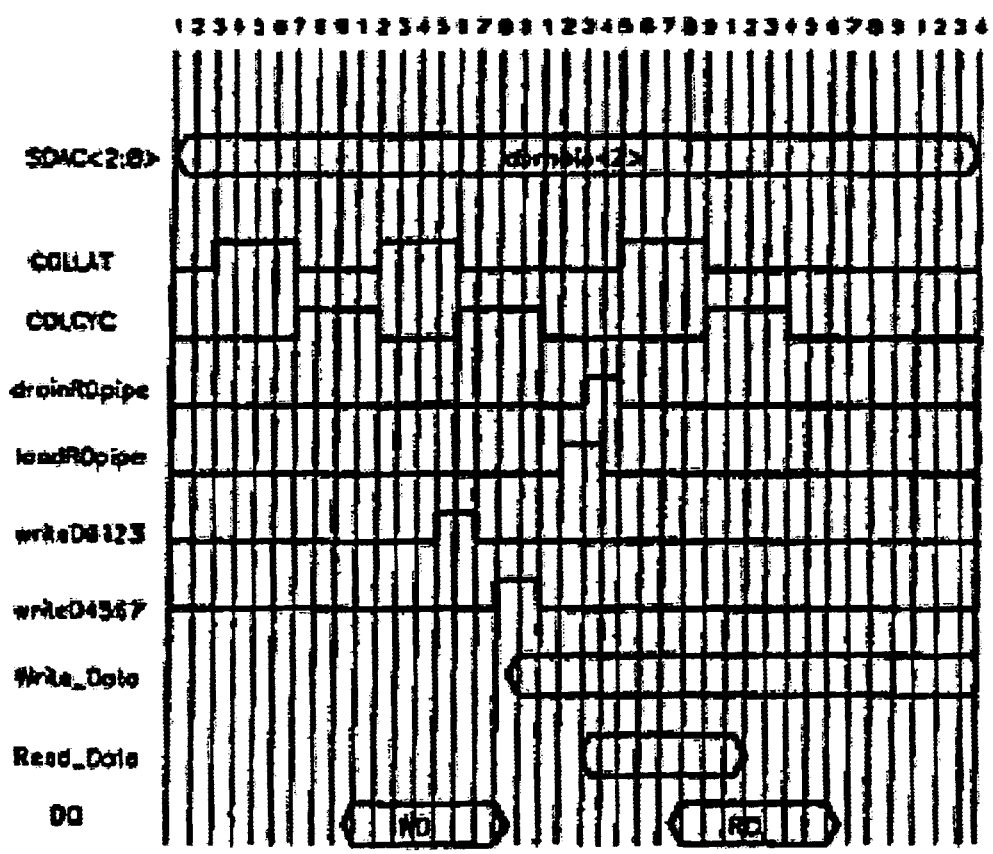

On one hand, as the domain signal domain<5:2> is 0001 in a domain 2, only the fifth transfer gate 393 of the transfer means 392 is turned off, the sixth to the eighth transfer gate 394–396 are turned on. At this time, as a first transfer gate 384 of the delay means 383 is turned on and an output of a shift means 381 is inputted to an input of a first flip flop 385 via the first transfer gate 384, it is triggered in an ascending edge of a clock signal tclk and delayed by 1t cycle, then its output is inputted to an input of the fifth transfer gate 393 of the transfer gate 392. Accordingly, it is delayed by 1t cycle via a first delay means of a delay means according to a domain signal domain<5:2> of 0001 and outputted via the sixth to the eighth transfer gate 394–396 in a domain 2, read data RD are delayed by it cycle and outputted via a data pad DQ as drawn in FIG. 7B.

As a domain signal domain<5:2> being generated from the first signal generating means 31 is 0011 in a domain 3, the fifth and the sixth transfer gate 393, 394 of the transfer gate 392 are turned off, a seventh and a eighth transfer gate 395, 396 are turned on. At this time, as a first and a second transfer gate 384, 386 of the delay means 383 is turned on, an output of a shift means 381 delayed by 1t cycle via a first flip flop 385 of a first delay means is inputted to a second flip flop 387 again via a second transfer gate 386 and delayed by 1t cycle again, an output signal of the shift means 381 delayed by 2t cycle is inputted to a seventh transfer gate 395.

Figure 8A:
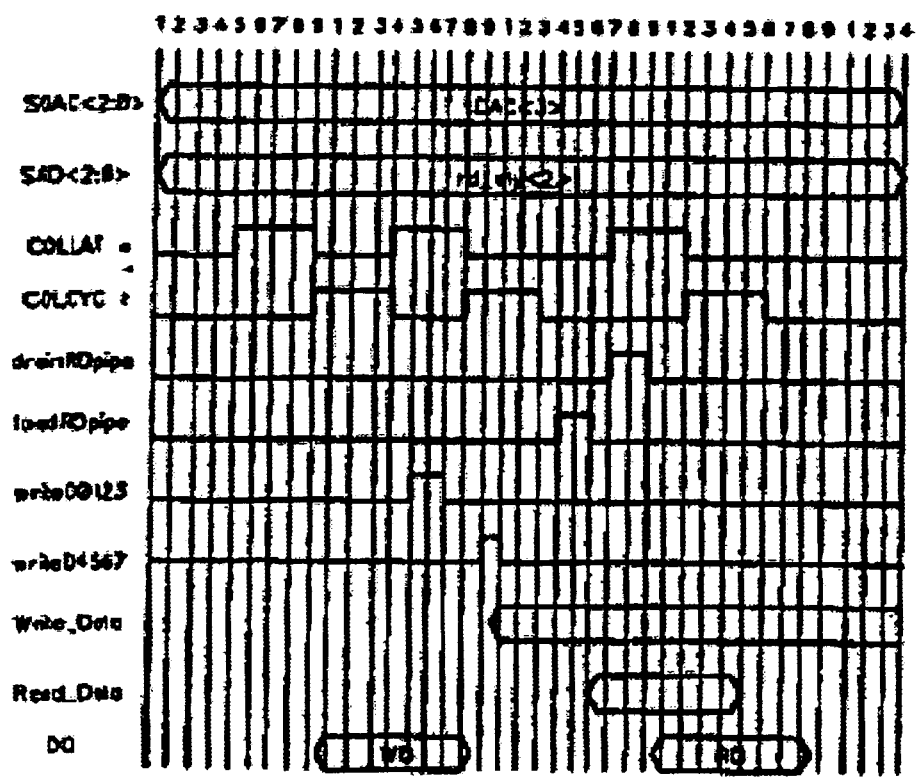
Figure 8B:
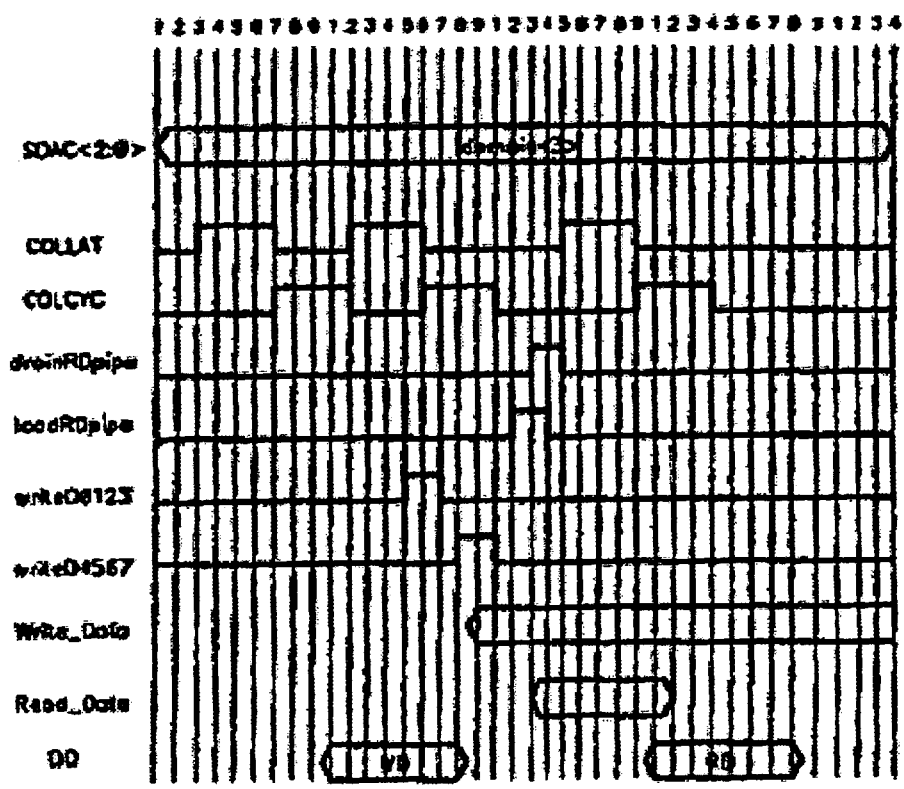
Figure 9A:
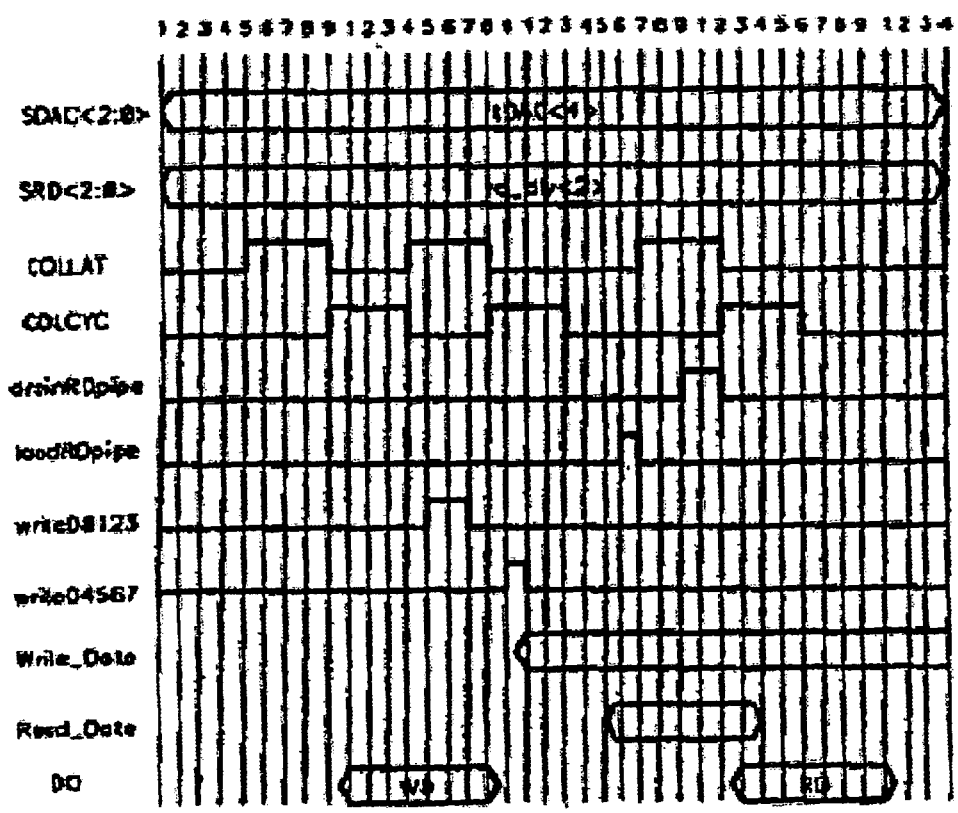
Figure 9B:
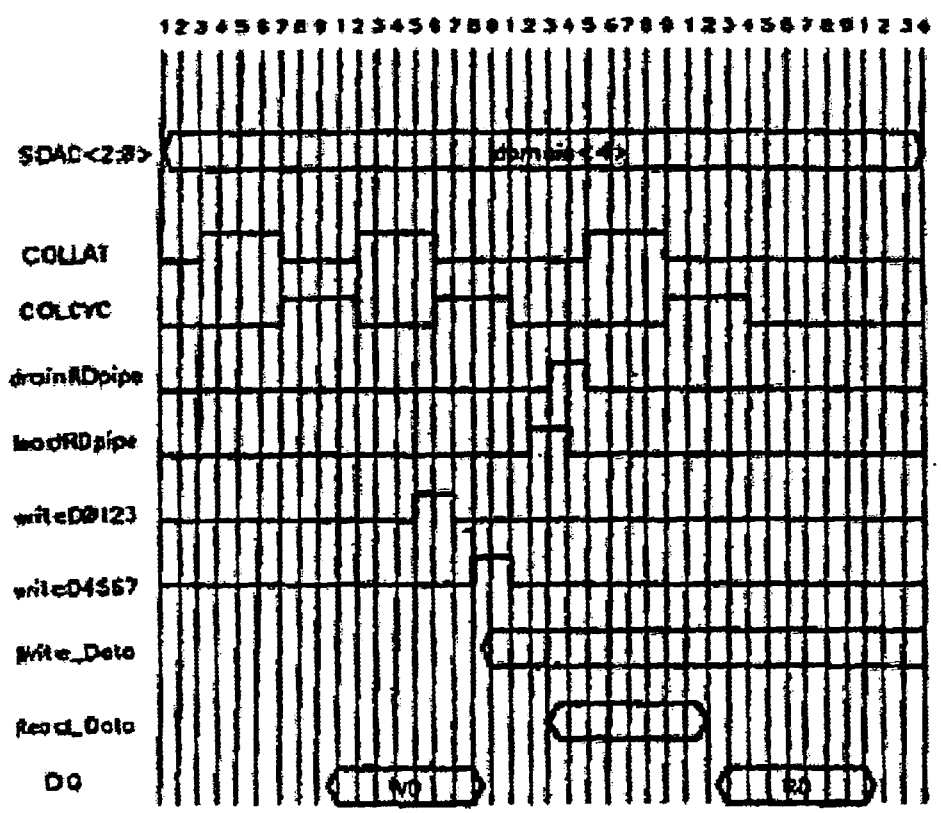

Therefore, the data Read_Data read from a core block 20 according to a domain signal domain<5:2> are delayed by 2t cycle in a domain 3, then transferred to a data pad DQ via the seventh to the eighth transfer gate 395, 396 and outputted as read data delayed by 2t cycle as drawn in FIG. 8B.

On one hand, as a domain signal domain<5:2> being generated from the first signal generating means 31 is 0111 in a domain 4, the fifth to the seventh transfer gate 393–395 of the transfer gate 392 are turned off, only the eighth transfer gate 396 is turned on. At this time, a first to a third transfer gate 384, 386, 388 of a first to a third delay means of a delay means 383 are turned on, thus read data Read_ data shifted via a shift means 381 according to this are delayed by 2t cycle via a second flip flop 387 of a second delay means, then transferred again to a third flip flop 389 via a third transfer gate 388 of a third delay means and delayed by 1t cycle again. Accordingly, as it is delayed by 3t cycle via a first to a third delay means of a delay means 383 and transferred via the eighth transfer gate 396 in a domain 4, the data Read_data read from the core block 10 are delayed by 3t cycle and outputted as read data RD via a data pad DQ.

Finally, as a domain signal domain<5:2> being generated from the first signal generating means 31 is 1111 in a domain 5, all the fifth to the eighth transfer gate 393–396 of the transfer gate 392 are turned off, at this time, all the first to a fourth transfer gate 384, 386, 388, 390 of a delay means 383 are turned on, an output of a shift means 381 delayed by 3t cycle via a third flip flop 389 of a third delay means is transferred to a fourth flip flop 391 via a fourth transfer gate 390 of a fourth delay means and delayed by 1t cycle again.

Figure 10A:
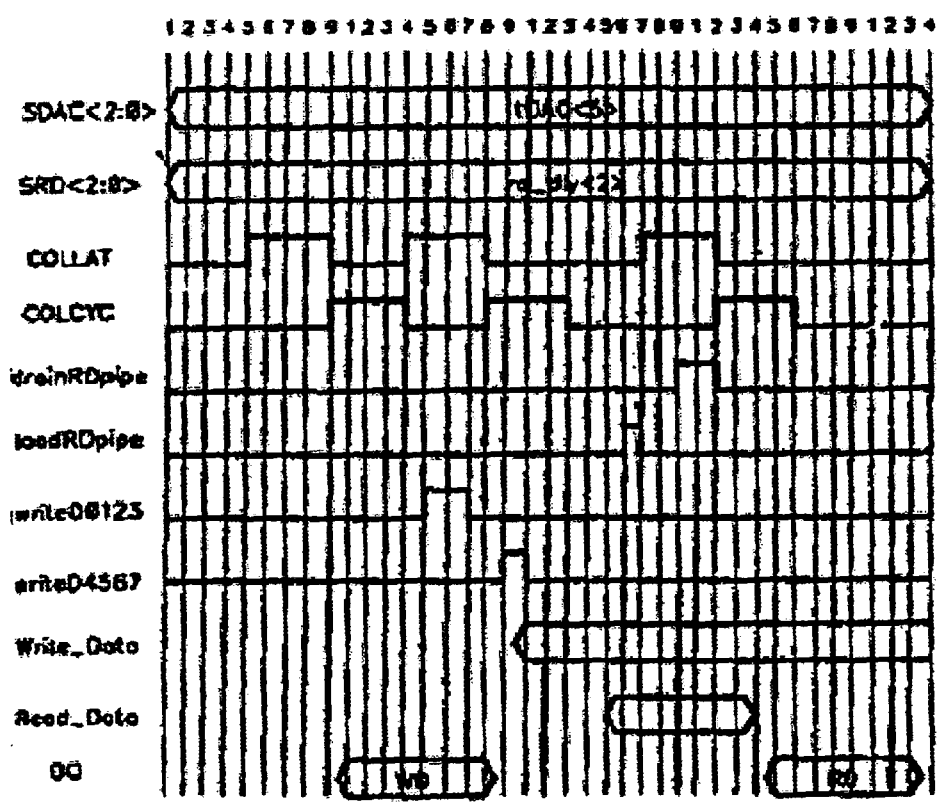
Figure 10B:
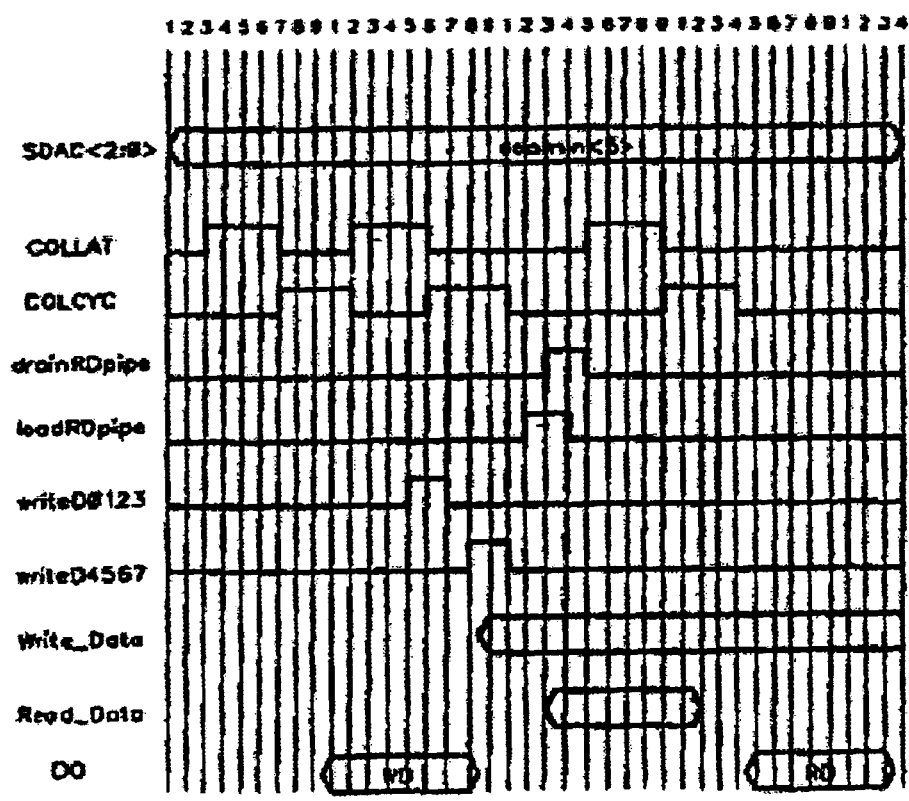

Accordingly, as drawn in FIG. 10B, the data read from the core block 20 are delayed by 4t cycle via a first to a fourth delay means and outputted as read data RD to a data pad DQ.

As described in above, the present invention enables to output the data delayed by 1t cycle exactly to a data pad by generating a domain signal to a data output shift part directly by using only the signal being generated from a register initializing a system and compensating for a time that data are outputted from the data output shift part by the domain signal. Therefore, a circuit operates stably by outputting the data delayed by 1t cycle directly and exactly and sequentially, without being affected by an intermediate internal signal, via a data pad.

As described in above, a data output time compensating circuit of this invention has an advantage, that is, it can output the output data delayed by 1t cycle exactly stably, besides, as a logic circuit for generating an intermediate internal signal isn't required, a composition of a logic circuit is simple and an area of a lay out is reduced.

Also, as a circuit operates stably and an unnecessary circuit composition is not necessary, by that a data output time is compensated for within a data output shift part, there is an advantage that a composition of a circuit of a data output shift part becomes simple, an area of a lay out is reduced. And, the present invention can be realized variously in a changed form within the scope that doesn't depart from the point of this invention.

What is claimed is:

1. A packet command driving type memory device comprising:
   a first signal generating means for receiving a signal being generated from a register and generating a domain signal of certain bit;
   a second and a third signal generating means for generating from a register within each of said second and third signal generating means a first and a second control signal for loading data;
   a fourth and a fifth signal generating means for generating a third and a fourth control signal for reading data from a core block;
   a data output shift part for shifting the data read from the core block according to the first and second control signals generated from the second and the third signal generating means and a clock signal, delaying the shifted data by a certain time according to the domain signal generated from the first signal generating means according to each domain and compensating for a data output time and outputting it.

2. The packet command driving type memory device as claimed in claim 1, wherein the data output shift part comprises:
   a shift means for shifting the data read from the core block according to the first and the second control signal generated from the second and a third signal generating means and a clock signal;
   a data output time compensating means for delaying an output signal of the shift means by a certain time according to the domain signal generated from the first signal generating means and compensating for a data output time, outputting the compensated signal as read data via a data pad.

3. The packet command driving type memory device as claimed in claim 2, wherein the data output time compensating means comprises:
   a delay means for delaying the output signal of the shift means by a certain time according to the domain signal generated from the first signal generating means;
   a transfer means for transferring one of the signal delayed via the delay means or the output signal of the shift means as read data according to the domain signal generated from the first signal generating means.

4. The packet command driving type memory device as claimed in claim 3, wherein the domain signal is 4 bits signal, the domain is divided to 5 domains.

5. The packet command driving type memory device as claimed in claim 3, wherein the delay means comprises a number of means for delaying the output signal of the shift means by 1t cycle according to the domain signal.

6. The packet command driving type memory device as claimed in claim 5, wherein the first delay means comprises:
   a first transfer gate for transferring the output signal of the shift means according to a first domain signal of the domain signal generated from the first signal generating means;
   a first flip flop for delaying the data transferred via the first transfer gate by 1t cycle in response to the clock signal.

7. The packet command driving type memory device as claimed in claim 5, wherein the second delay means comprises:
   a second transfer gate for transferring the data delayed by 1t cycle via the first flip flop of the first delay means according to a second domain signal of the domain signal generated from the first signal generating means;
   a second flip flop for delaying an output of the second transfer gate by 1t cycle in response to the clock signal and outputting data delayed by 2t cycle.

8. The packet command driving type memory device as claimed in claim 5, wherein the third delay means comprises:
   a third transfer gate for transferring the data delayed by 2t cycle via the second flip flop of the second delay means according to a third domain signal of the domain signal generated from the first signal generating means;
   a third flip flop for delaying data transferred via the second transfer gate by 1t cycle again in response to the clock signal and outputting data delayed by 3t cycle.

9. The packet command driving type memory device as claimed in claim 5, wherein the fourth delay means comprises:
   a fourth transfer gate for transferring the signal delayed by 3t cycle via the third flip flop of the third delay means according to a fourth domain signal of the domain signal generated from the first signal generating means;
   a fourth flip flop for delaying data transferred via the transfer gate by 1t cycle in response to the clock signal and outputting data delayed by 4t cycle.

10. The packet command driving type memory device as claimed in claim 3, wherein the transfer means comprises a first to a fourth transfer means for transferring the output signal of the shift means according to the domain signal generated from the first signal generating means or the signal delayed via the first to the fourth delay means of the delay means.

11. The packet command driving type memory device as claimed in claim 10, wherein the first transfer means comprises a fifth transfer gate for transferring the output signal of the shift means according to a first domain signal of the domain signal generated from the first signal generating means.

12. The packet command driving type memory device as claimed in claim 10, wherein the second transfer means comprises a sixth transfer gate for transferring the output signal of the shift means in a first domain, an output of the first delay means in a second domain according to a second domain signal of the domain signal generated from the first signal generating means.

13. The packet command driving type memory device as claimed in claim 10, wherein the third transfer means comprises a seventh transfer gate for transferring an output of the sixth transfer gate in a first domain, an output of the second delay means in a third domain according to a third domain signal of the domain signal generated from the first signal generating means.

14. The packet command driving type memory device as claimed in claim 10, wherein the fourth transfer means comprises a eighth transfer gate for transferring an output of the seventh transfer gate in a first domain, an output of the third delay means in a third domain according to a fourth domain signal of the domain signal generated from the first signal generating means.

15. A packet command driving type memory device comprising:
   a first signal generating means for receiving a signal being generated from a register and generating a domain signal of certain bit;
   a second and a third signal generating means for generating a first and a second control signal for shifting data;
   a fourth and a fifth signal generating means for generating a third and a fourth control signal for reading data from a core block;

a data output shift part having a shift means for shifting the data read from the core block according to the first and second control signals generated from the second and the third signal generating means and a clock signal, a data output time compensating means for delaying the data shifted via the shift means by a certain time according to each domain and compensating for a data output time and outputting the compensated signal as read data via a data pad;

the data output shift part outputs the data transferred via the shift means in a domain 1, outputs the data transferred via the shift means as read data to the data pad via the transfer means by delaying them by 1t cycle via a delay means and compensating for a data output time in a domain 2, outputs the data transferred via the shift means as read data to the data pad via the transfer means by delaying them by 2t cycle via a delay means and compensating for a data output time in a domain 3, outputs the data transferred via the shift means as read data to the data pad via the transfer means by delaying them by 3t cycle via a delay means and compensating for a data output time in a domain 4, outputs the data transferred via the shift means as read data to the data pad directly by delaying them by 4t cycle via a delay means and compensating for a data output time in a domain 5.

* * * * *